(12) United States Patent
Inoue

(10) Patent No.: US 7,116,040 B2
(45) Date of Patent: Oct. 3, 2006

(54) ELECTRONIC COMPONENT AND FILTER INCLUDING THE SAME

(75) Inventor: Kenji Inoue, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 11/009,021

(22) Filed: Dec. 13, 2004

(65) Prior Publication Data
US 2005/0146242 A1 Jul. 7, 2005

(30) Foreign Application Priority Data
Dec. 18, 2003 (JP) .......................... P2003-420586

(51) Int. Cl.
*H03H 9/03* (2006.01)
*H03H 9/205* (2006.01)
*H03H 9/52* (2006.01)

(52) U.S. Cl. ...................... 310/366; 310/320; 310/367; 310/368; 333/187; 333/192

(58) Field of Classification Search ................. 310/320, 310/360, 365–370; 333/186–192
See application file for complete search history.

(56) References Cited

U.S. PATENT DOCUMENTS

| 4,114,062 A | * | 9/1978 | Mattuschka ................. 310/326 |
| 4,584,499 A | * | 4/1986 | Leskovec et al. ........... 310/318 |
| 6,842,089 B1 | * | 1/2005 | Lee ............................. 333/189 |
| 6,946,772 B1 | * | 9/2005 | Inoue et al. ............. 310/313 R |
| 2005/0093656 A1 | * | 5/2005 | Larson et al. ............... 333/191 |

FOREIGN PATENT DOCUMENTS

JP         55-140314         * 11/1980   .................. 333/191

OTHER PUBLICATIONS

Thin Film Resonator Technology by K.M. Lakin IEEE 2003 FCS-EFTF Paper We1A-4 May 5-8, 2003.*
K.M. Lakin et al.; "Solidly Mounted Resonators and Filters"; IEEE Ultrasonics Symposium; pp. 905-908; dated 1995.

* cited by examiner

*Primary Examiner*—Thomas M. Dougherty
(74) *Attorney, Agent, or Firm*—Oliff & Berridge, PLC

(57) ABSTRACT

An electronic component of an embodiment of the present invention comprises a first piezoelectric thin film resonator and a second piezoelectric thin film resonator. The first piezoelectric thin film resonator and second piezoelectric thin film resonator are a piezoelectric thin film resonator that has a structure in which a piezoelectric thin film is interposed between a lower electrode and an upper electrode, that is constituted in an area where the lower electrode, piezoelectric thin film, and upper electrode overlap each other, and that obtains a signal with a predetermined resonance frequency by bulk waves propagating inside the piezoelectric thin film. The interval between a part of a periphery of the first piezoelectric thin film resonator and a part of a periphery of the second piezoelectric thin film resonator that face each other is not constant.

7 Claims, 16 Drawing Sheets

ELECTRONIC COMPONENT AND FILTER INCLUDING THE SAME

BACKGROUND OF THE INVENTION

1. Field of the Invention

The present invention relates to a piezoelectric thin film resonator and a filter using the same, and particularly to an effective technology which is applied for preventing unnecessary acoustic coupling that occurs between the piezoelectric thin film resonators.

2. Related Background of the Invention

The demand for compact and low-loss RF filters has been growing along with the development of cell-phones. Further, due to the requests for high-speed and large-capacity communications, higher-frequency carrier waves have been progressively developing in the communication systems.

In response to such requests, the filters that use piezoelectric thin film resonators have been drawing increasing attention recently. The piezoelectric thin film resonator has a structure in which a piezoelectric thin film is interposed between upper and lower electrode films, and presents a predetermined resonance characteristic by applying a high frequency signal between the upper and lower electrode films. Such a filter that uses a piezoelectric thin film resonator has a structure in which the piezoelectric thin film resonators are electrically connected in a ladder shape.

In a conventional filter, a piezoelectric thin film resonator has a shape of an oblong or a square, that is, a shape of a rectangle. Note that a description of the shape of a piezoelectric thin film resonator can be found in 1995 IEEE ULTRASONICS SYMPOSIUM P905–908/SOLIDLY MOUNTED RESONATORS AND FILTERS, and especially in FIG. 4 therein.

In the present invention, "the shape of a piezoelectric thin film resonator" does not indicate an individual shape of a piezoelectric thin film or electrode films that constitute a piezoelectric thin film resonator, but indicates the shape of an area in which a piezoelectric thin film and electrode films having this piezoelectric thin film interposed therebetween overlap each other. In other words, the shape of a piezoelectric thin film resonator indicates an area in which a piezoelectric thin film and two electrode films having this piezoelectric thin film interposed therebetween overlap each other, when looking at the piezoelectric film and the two electrode films in a direction where they are arranged in a line.

Incidentally, regarding a filter, it is important that the interval between adjacent piezoelectric thin film resonators is designed to be as narrow as possible in order to achieve a low-loss by miniaturizing a chip and reducing the length of a wire.

SUMMARY OF THE INVENTION

However, it is concerned that, if the interval between the adjacent piezoelectric thin film resonators is narrowed, acoustic coupling occurs as the vibrating parts approach, thereby generating a new resonance mode.

Generally, a mode generated by new acoustic coupling becomes an unnecessary spurious mode, which deteriorates the filter characteristics. Further, by narrowing down the interval between the adjacent piezoelectric thin film resonators, the problems of the production become significant.

Specifically, in resist patterning of the electrode films, especially the upper electrode film, the resolution on the portion in which the pattern is concentrated is deteriorated easily. Further, in the etching, the density of the pattern at a space between the electrodes is different from that of the area other than the space, thereby causing problems such that the etching rate is different, which causes the fluctuation of characteristics, the etching damage and the like. Therefore, in the prior art, a ten-odd μm space was provided between the adjacent piezoelectric thin film resonators.

Moreover, an oblong piezoelectric thin film resonator has a low degree of freedom of layout in the rotation direction, thus is disadvantageous in miniaturization of the filter. On the other hand, a square piezoelectric thin film resonator has a high degree of freedom of layout compared to an oblong piezoelectric thin film resonator. However, the square piezoelectric thin film resonator needs to be designed such that each side thereof does not become parallel with the adjacent piezoelectric thin film resonators in order to reduce spurious component, in other words, the piezoelectric thin film resonators are affected by the adjacent piezoelectric thin film resonators, thus it is difficult to determine the layouts thereof independently.

Therefore, an object of the present invention is to provide a technology which can prevent poor patterning of an piezoelectric thin film resonator.

Further, an object of the present invention is to provide a technology which can prevent unnecessary acoustic coupling that occurs between the piezoelectric thin film resonators.

Furthermore, an object of the present invention is to provide a technology which can increase the degree of freedom of layout of the piezoelectric thin film resonator.

One aspect of the present invention relates to electronic components. A first electronic component of the present invention comprises a first piezoelectric thin film resonator and a second piezoelectric thin film resonator each of which has a structure in which a piezoelectric thin film is interposed between a first electrode film and a second electrode film, is constituted in an area in which the first electrode film, piezoelectric thin film and second electrode film overlap with each other, and obtains a signal with a predetermined resonance frequency by bulk waves propagating inside the piezoelectric thin film, wherein the first piezoelectric thin film resonator and second piezoelectric thin film resonator are adjacent to each other, and an interval between a part of an outer periphery of the first piezoelectric thin film resonator and a part of an outer periphery of the second piezoelectric thin film resonator which face each other is not constant.

Specifically, the first electronic component of the present invention comprises a first piezoelectric thin film resonator and a second piezoelectric thin film resonator. The second piezoelectric thin film resonator is provided next to the first piezoelectric thin film resonator. Each of the first piezoelectric thin film resonator and second piezoelectric thin film resonator is a piezoelectric thin film resonator that has a structure in which the piezoelectric thin film is interposed between the first electrode film and the second electrode film, that is constituted in an area in which the first electrode film, piezoelectric thin film and second electrode film overlap with each other, and that obtains a signal with a predetermined resonance frequency by bulk waves propagating inside the piezoelectric thin film. When assuming two straight lines intersecting at a part of a periphery of the first piezoelectric thin film resonator and a part of a periphery of the second piezoelectric thin film resonator which face each other, the distance between a point at the intersection of one of the two straight lines with the abovementioned part of the first piezoelectric thin film resonator and a point at the intersection of the straight line with the abovementioned part of the second piezoelectric thin film resonator is different from the distance between a point at the intersection of the other straight line of the two straight lines with the abovementioned part of the first piezoelectric thin film resonator and a point at the intersection of the abovementioned other line with the abovementioned part of the second piezoelectric thin film resonator. Note that the piezoelectric thin film of the first piezoelectric thin film resonator and a piezoelectric thin film of the second piezoelectric thin film resonator can be continuous.

A second electronic component of the present invention is the first electronic component wherein the first piezoelectric thin film resonator and second piezoelectric thin film resonator have an elliptical shape.

A third electronic component of the present invention is the second electronic component wherein an extension of a major axis with respect to the periphery of the first piezoelectric thin film resonator in the second electronic component intersects with a major axis or an extension thereof with respect to the periphery of the second piezoelectric thin film resonator. Note that the extension of the major axis with respect to the periphery of the first piezoelectric thin film resonator preferably intersects with the major axis with respect to the periphery of the second piezoelectric thin film resonator.

A fourth electronic component of the present invention comprises a first piezoelectric thin film resonator and a second piezoelectric thin film resonator. The second piezoelectric thin film resonator is provided next to the first piezoelectric thin film resonator. Each of the first piezoelectric thin film resonator and second piezoelectric thin film resonator is a piezoelectric thin film resonator that has a structure in which the piezoelectric thin film is interposed between the first electrode film and the second electrode film, that is constituted in an area in which the first electrode film, piezoelectric thin film and second electrode film overlap with each other, and that obtains a signal with a predetermined resonance frequency by bulk waves propagating inside the piezoelectric thin film. A periphery of the first piezoelectric thin film resonator facing a periphery of the second piezoelectric thin film resonator comprises a portion formed with an engrailed line or a curved line. The periphery of the second piezoelectric thin film resonator facing the periphery of the first piezoelectric thin film resonator comprises a portion formed with an engrailed line or a curved line which has a constant interval with respect to the engrailed line or the curved line of the first piezoelectric thin film resonator periphery. Note that the piezoelectric thin film of the first piezoelectric thin film resonator and the piezoelectric thin film of the second piezoelectric thin film resonator can be continuous.

Another aspect of the present invention relates to filters. A first filter of the present invention comprises any one of the abovementioned first to fourth electronic components.

A second filter of the present invention is a first filter further including an input electrode pad, output electrode pad, and a first wiring portion formed between the input electrode pad and output electrode pad, and a second wiring portion formed between the first wiring portion and a ground electrode pad. In the second filter, either one of the first and second piezoelectric thin film resonators is electrically connected to the first wiring portion. The other of the first piezoelectric thin film resonator and second piezoelectric thin film resonator is electrically connected to the second wiring portion. Further, the abovementioned other of the first piezoelectric thin film resonator and second piezoelectric thin film resonator has an anti-resonance frequency substantially equal to the resonance frequency of the one of the first piezoelectric thin film resonator and second piezoelectric thin film resonator.

A third filter of the present invention is the second filter further including a device substrate having a rectangular shape. In the third filter, the ground electrode pads are respectively disposed in the vicinities of two corners on the device substrate, the corners being farthest from each other.

DESCRIPTION OF THE PREFERRED EMBODIMENTS

The best mode for carrying out the present invention will now be described in detail hereinbelow with reference to the drawings. The same members will be denoted by the same reference symbols throughout the accompanying drawings, without redundant description. It is noted that the description herein concerns the best mode for carrying out the present invention and that the present invention is by no means intended to be limited to the mode.

(First Embodiment)

Figure 1:
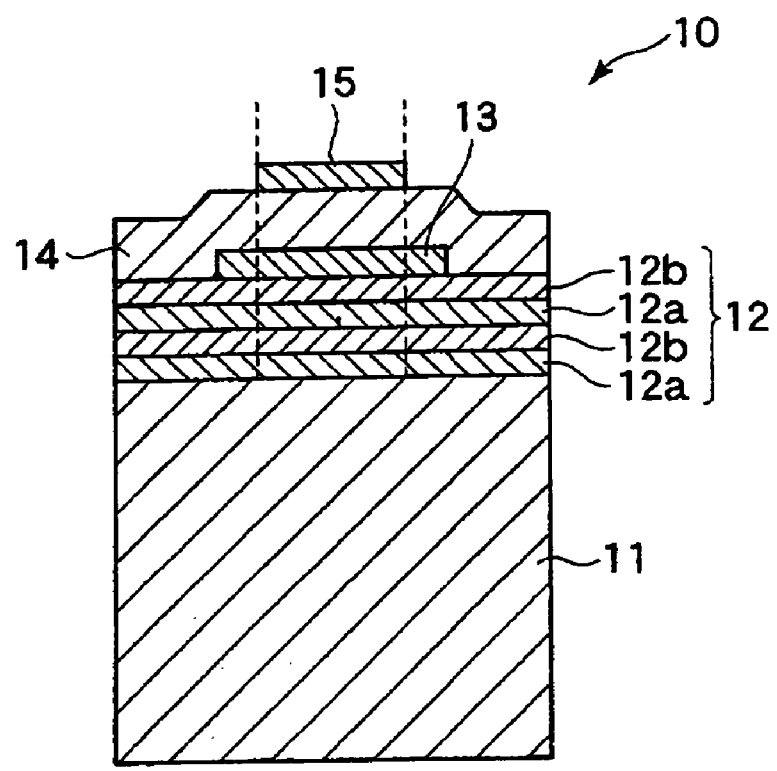
FIG. 1 is a cross sectional view showing a piezoelectric thin film resonator that constructs a filter related to a first embodiment of the present invention.
Figure 2:
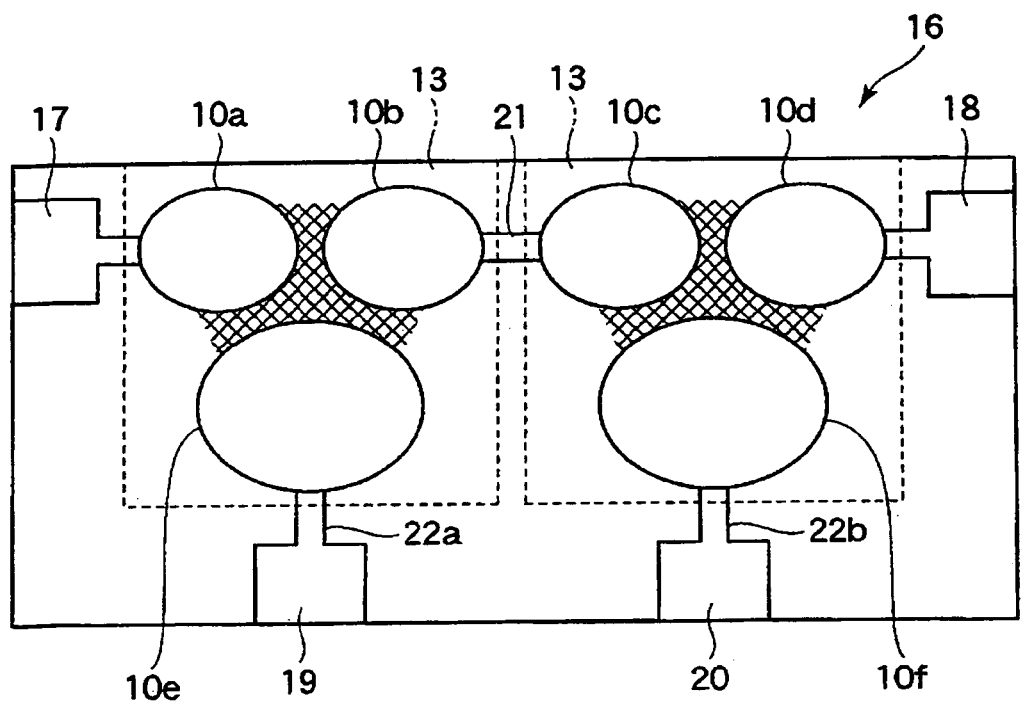
FIG. 2 is an explanatory drawing showing a filter related to the first embodiment of the present invention.
Figure 3:
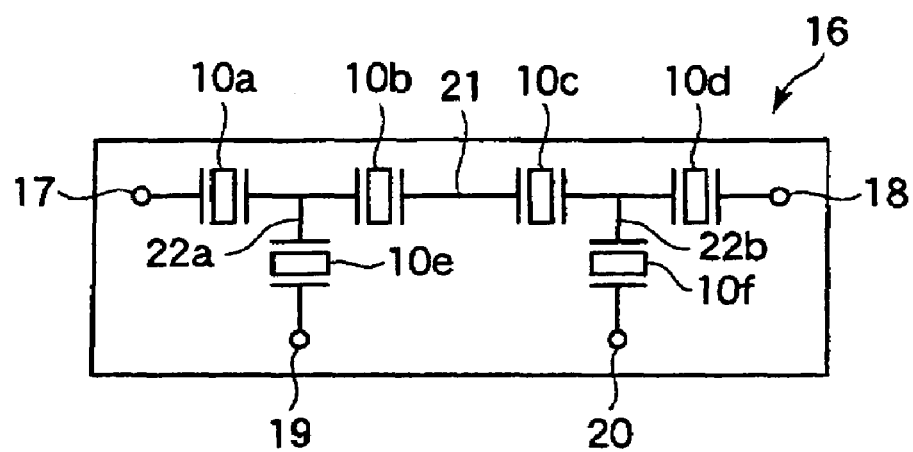
FIG. 3 is a circuit diagram of the filter of FIG. 2.
Figure 4:
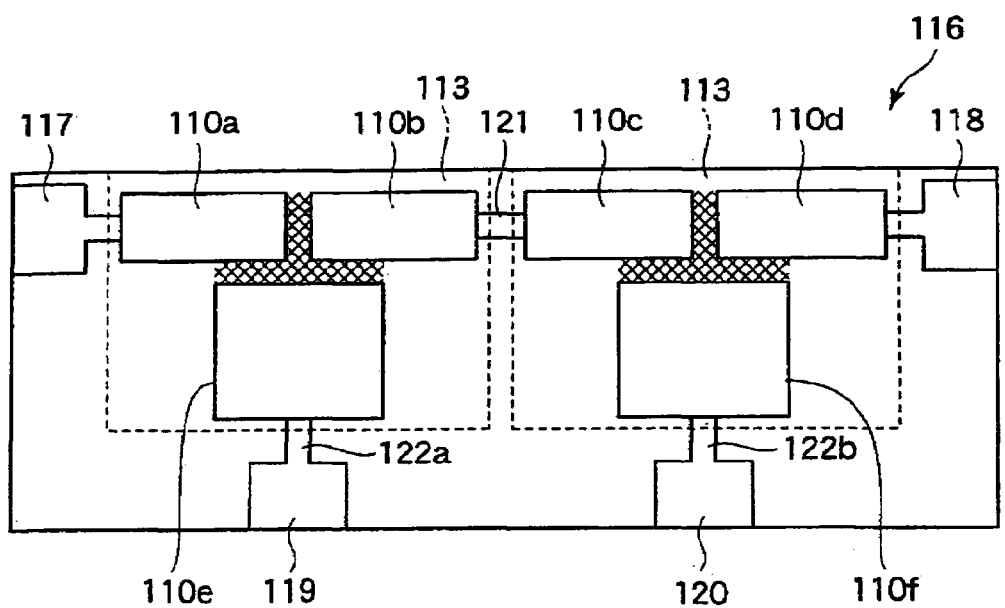
FIG. 4 is an explanatory drawing showing a filter as a comparative example.

FIG. 1 is a cross sectional view showing a piezoelectric thin film resonator that constructs a filter related to a first embodiment of the present invention. FIG. 2 is an explanatory drawing showing a filter related to the first embodiment of the present invention. FIG. 3 is a circuit diagram of the filter of FIG. 2. FIG. 4 is an explanatory drawing showing a filter as a comparative example.

As shown in FIG. 1, a piezoelectric thin film resonator 10 that constructs a filter of the present embodiment is called an SMR (Solidly Mounted Resonator) type piezoelectric thin film resonator". In the piezoelectric thin film resonator 10 in this case, an acoustic reflecting film 12 is formed, for example, on a device substrate 11 of single-crystal silicon. The acoustic reflection film 12 is comprised of total four layers of alternately stacked thin film having a high acoustic impedance and thin film having a low impedance, such as an AlN film 12a and $SiO_2$ film 12b. A Pt film is deposited on this acoustic reflection film 12 by means of a vacuum vapor deposition, which is then subjected to patterning by means of lithography, thereby forming a lower electrode (first electrode film) 13.

Further, a piezoelectric thin film 14 constituted of ZnO or AlN is deposited by means of sputtering so as to cover the lower electrode 13. Al is deposited on the piezoelectric thin film 14 by means of the sputtering, which is then subjected to patterning by means of lithography, thereby forming an upper electrode (second electrode film) 15.

In such a piezoelectric thin film resonator 10, when an AC voltage is applied to the lower electrode 13 and upper electrode 15, a signal with a predetermined resonance frequency is obtained by bulk waves propagating inside the piezoelectric thin film 14, due to piezoelectric effects.

The acoustic reflection film 12 may not be formed, in which case the lower electrode 13 is directly formed on the device substrate 11. Further, although the acoustic reflection film 12 consists of four layers in the present embodiment, it is not limited to four layers as long as there are laminated thin films having different acoustic impedances. Furthermore, the film material of each thin film is not limited to the above-described one given as an example. For example, a thin film as a bonding layer may be formed between the acoustic reflection film 12 and lower electrode 13, or between the piezoelectric thin film 14 and upper electrode 15.

The shape of the piezoelectric thin film resonator 10 is, as described above, a shape of an area in which the piezoelectric thin film 14, and the lower electrode 13 and upper electrode 15 having this piezoelectric thin film 14 interposed therebetween overlap each other, thus, as shown in FIG. 1, is a shape when a area between two dashed lines extending vertically is viewed planimetrically. This shape is shown in FIG. 2. Specifically the two dashed lines shown in FIG. 1 indicate the periphery of the piezoelectric thin film resonator 10.

A filter 16 is formed by the layout of piezoelectric thin film resonators 10a to 10f having the same layer configuration as the above-mentioned piezoelectric thin film resonator 10. Specifically, the filter 16 of this embodiment is constituted by the piezoelectric thin film resonators 10a to 10f with an elliptical shape that are formed on the device substrate with a rectangular shape. In other words, the filter 16 comprises electronic components comprising the piezoelectric thin film resonators 10a to 10f.

As shown in FIG. 2 and FIG. 3, in the filter 16 a first wiring portion 21 as a series arm is formed between an input electrode pad 17 and an output electrode pad 18. The first wiring portion 21 serially connects the four piezoelectric thin film resonators 10a, 10b, 10c, and 10d.

Further, second wiring portions 22a and 22b as the parallel arms are formed respectively between the midpoint between the piezoelectric thin film resonator 10a and piezoelectric thin film resonator 10b and a ground electrode pad 19, and between the midpoint between the piezoelectric thin film resonator 10c and piezoelectric thin film resonator 10d and a ground electric pad 20. On the second wiring portions 22a and 22b, the piezoelectric thin film resonators 10e and 10f are respectively disposed. The piezoelectric thin film resonators 10e and 10f have an anti-resonance frequency substantially equal to a resonance frequency of the piezoelectric thin film resonators 10a, 10b, 10c and 10d, and form pass bands with the piezoelectric thin film resonators 10a, 10b, 10c and 10d.

In FIG. 2 the portion indicated by the elliptical shape as the periphery of each of the piezoelectric thin film resonators 10a to 10f is identical to the shape of the upper electrode 15 (see FIG. 1). The electrode pads 17 to 20, the first wiring portion 21 and the second wiring portions 22a and 22b are formed in the same deposition process as the deposition process for forming the upper electrode 15. Further, the areas indicated by a dashed line enclosing the piezoelectric thin film resonators 10a, 10b and 10e, and the area indicated by a dashed line enclosing the piezoelectric thin film resonators 10c, 10d and 10f are the lower electrodes 13. Note that the piezoelectric thin film 14 (see FIG. 1) is formed on the entire surface of the device substrate in the present embodiment. Specifically, the respective piezoelectric thin films of the piezoelectric thin film resonators 10a to 10f are continuous.

Therefore, in the case shown in FIG. 2, the piezoelectric thin film resonators 10a, 10b and 10e are electrically connected to each other by the lower electrode, and also the piezoelectric thin film resonators 10c, 10d and 10f are electrically connected to each other by the lower electrode.

Here, it is only necessary that there be at least one piezoelectric thin film resonator to be disposed in the first wiring portion 21, which is a series arm. Further, it is only necessary that at least one second wiring portion be formed. Therefore, it is only necessary that at least one piezoelectric thin film resonator on the parallel arm be formed. Moreover, the filter of the present invention is not limited to the one having such a ladder structure, thus various structures can be employed.

The shape of the piezoelectric thin film resonator is a shape of the area in which the piezoelectric thin film 14, and the lower electrode 13 and upper electrode 15 having the piezoelectric thin film 14 interposed therebetween overlap each other. Hence, not only the configuration as described in the present embodiment in which the upper electrode 15 has an elliptical shape and the piezoelectric thin film 14 and lower electrode 13 are wider than the upper electrode 15 is employed, but also a configuration in which only the piezoelectric thin film 14 or lower electrode 13 has an elliptical shape and the rest is wider than this elliptical shape can be employed. Furthermore, any two of the three thin films of the upper electrode 15, piezoelectric thin film 14, and lower electrode 13, or all the three thin films may have an elliptical shape. Moreover, any of the above three thin films may not have an elliptical shape, but the overlapping portion thereof may be constituted to have an elliptical shape.

Now, FIG. 4 shows a filter as a comparative example configured by the conventional piezoelectric thin film resonator.

In a filter 116 shown in FIG. 4, a first wiring portion 121 as a series arm is formed between an input electrode 117 and an output electrode 118. In this first wiring portion 121, four piezoelectric thin film resonators 110a, 110b, 110c and 110d are connected in series. Further, second wiring portions 122a and 122b as series arms are respectively formed between the midpoint between the piezoelectric thin film resonator 110a and piezoelectric thin film resonator 110b and a ground electrode pad 119, and between the midpoint between the piezoelectric thin film resonator 110c and piezoelectric thin film resonator 110d and a ground electrode pad 120. Piezoelectric thin film resonators 110e and 110f are respectively disposed on the second wiring portions 122a and 122b. The piezoelectric thin film resonators 110e and 110f have an anti-resonance frequency substantially equal to the resonance frequency of the piezoelectric thin film resonators 110a, 110b, 110c and 110d. The piezoelectric thin film resonators 110e and 110f form pass bands with the piezoelectric thin film resonators 110a, 110b, 110c and 110d. In FIG. 4, the dimensions of the piezoelectric thin film resonators and the shortest distance between the resonators are same as what is shown in FIG. 2.

In FIG. 4 as well, the portions shown as the shapes of the piezoelectric thin film resonators 110a to 110f are identical to the shape of the upper electrode, and the area indicated by a dashed line enclosing the piezoelectric thin film resonators 110a, 110b and 110e, and the area indicated by a dashed line enclosing the piezoelectric thin film resonators 110c, 110d and 110f are a lower electrode 113. Further, the piezoelectric thin film is formed on the entire surface of the device substrate.

As shown in FIG. 4, the conventional piezoelectric thin film resonators 110a to 110f have an oblong (rectangular) shape, and the interval between the adjacent piezoelectric thin film resonators is constant.

Consequently, because the pattern is concentrated in, for example, the area enclosed by the piezoelectric thin film resonator 110a, piezoelectric thin film resonator 110b and piezoelectric thin film resonator 110e (the area indicated by grid lines in FIG. 4), the patterning defects are easily caused due to the resist residue or a decrease in the etching rate in comparison with other portions.

In addition, since the outer circumference portions of the adjacent piezoelectric thin film resonators, which face mutually, are parallel with each other, the phases are likely to be coherent, whereby it is concerned that acoustic coupling occurs.

Furthermore, under the condition that the interval between the piezoelectric thin film resonators is constant, there is little freedom of layout, thus the design is constrained more.

In the filter 16 of the present embodiment, on the other hand, since the piezoelectric thin film resonators 10a to 10f have an elliptical shape, as shown in FIG. 2, even if the center-to-center distance of the adjacent piezoelectric thin film resonators (the first piezoelectric thin film resonator and the second piezoelectric thin film resonator) is the same as what is shown in FIG. 4, the distance between the peripheries of them that face each other can be extended. Therefore, concentration of the pattern due to expansion of, for example, the area surrounded by the piezoelectric thin film resonators 10a, 10b and 10e (the area indicated by the grid lines in FIG. 2) does not occur. Consequently, the patterning defects caused by the resist residue or a decrease in the etching rate during the pattern formation can be prevented.

Since the piezoelectric thin film resonators 10a to 10f are formed in an elliptical shape as described above, parallel sections no longer exist on the outer circumference portions of the adjacent piezoelectric thin film resonators which face mutually, that is, the peripheries. Specifically, the filter 16 comprises a electronic component related to the embodiment of the present invention, and a pair of piezoelectric thin film resonators that are adjacent to each other in the electronic component are equivalent to the first piezoelectric thin film resonator and the second piezoelectric thin film resonator. In such a filter 16, when assuming that there are two straight lines crossing at a part of the periphery of the first piezoelectric thin film resonator and a part of the periphery of the second piezoelectric thin film resonator which face each other, the distance between a point at the intersection of one of the two straight lines with the abovementioned part of the first piezoelectric thin film resonator and a point at the intersection of the above line with the abovementioned part of the second piezoelectric thin film resonator is different from the distance between a point at the intersection of the other line of the two straight lines with the abovementioned part of the first piezoelectric thin film resonator and a point at the intersection of the abovementioned other line with the abovementioned part of the second piezoelectric thin film resonator. Accordingly, the conditions under which the phases of the two adjacent piezoelectric thin film resonators are coherent are eliminated, and occurrence of unnecessary acoustic coupling can be prevented.

Further, since the piezoelectric thin film resonators 10a to 10f have an elliptical shape, the conditions under which the phases of the two piezoelectric thin film resonators are coherent are eliminated. Therefore, the degree of freedom of layout of the piezoelectric thin film resonators can be increased.

Furthermore, the area with a large dimensions is formed between the peripheries of the adjacent piezoelectric thin film resonators, thus the distance between the resonators can be narrowed in comparison with that in the case of the rectangular electrode.

In addition, by providing connection wirings (the first wiring portion 21, the second wiring portions 22a and 22b) at close proximity of the adjacent, elliptical shaped piezoelectric thin film resonators, the wiring resistance can be reduced.

(Second Embodiment)

Figure 5:
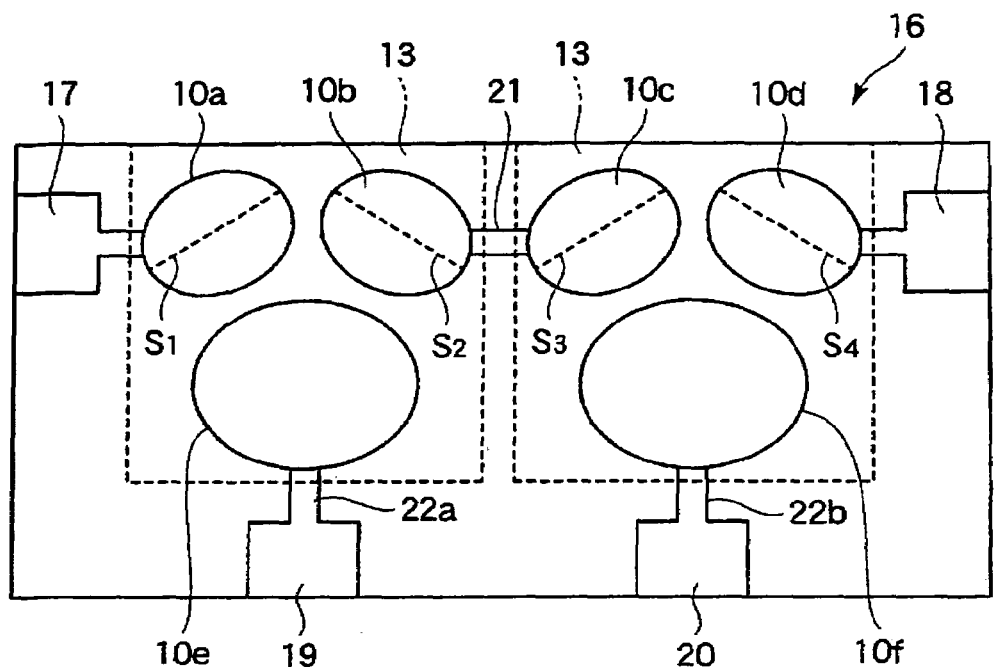
FIG. 5 is an explanatory drawing showing a filter related to a second embodiment of the present invention.
Figure 6:
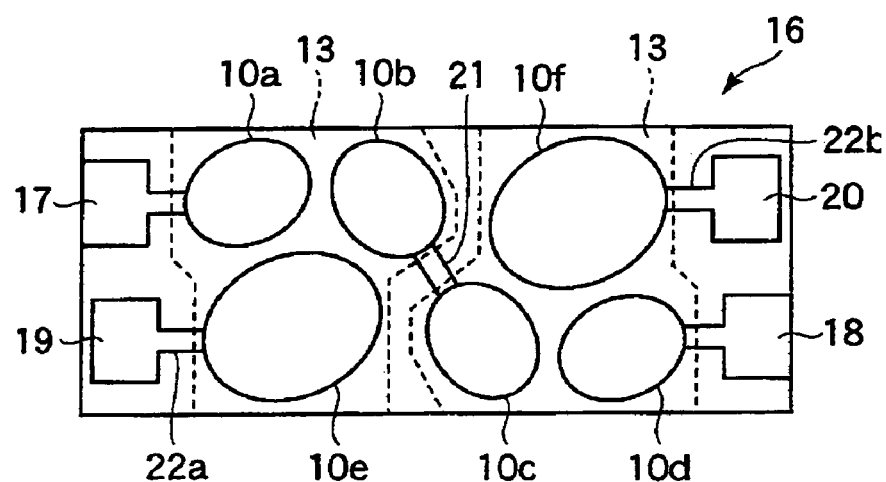
FIG. 6 is an explanatory drawing showing a filter of a modified example of the second embodiment of the present invention.
Figure 7:
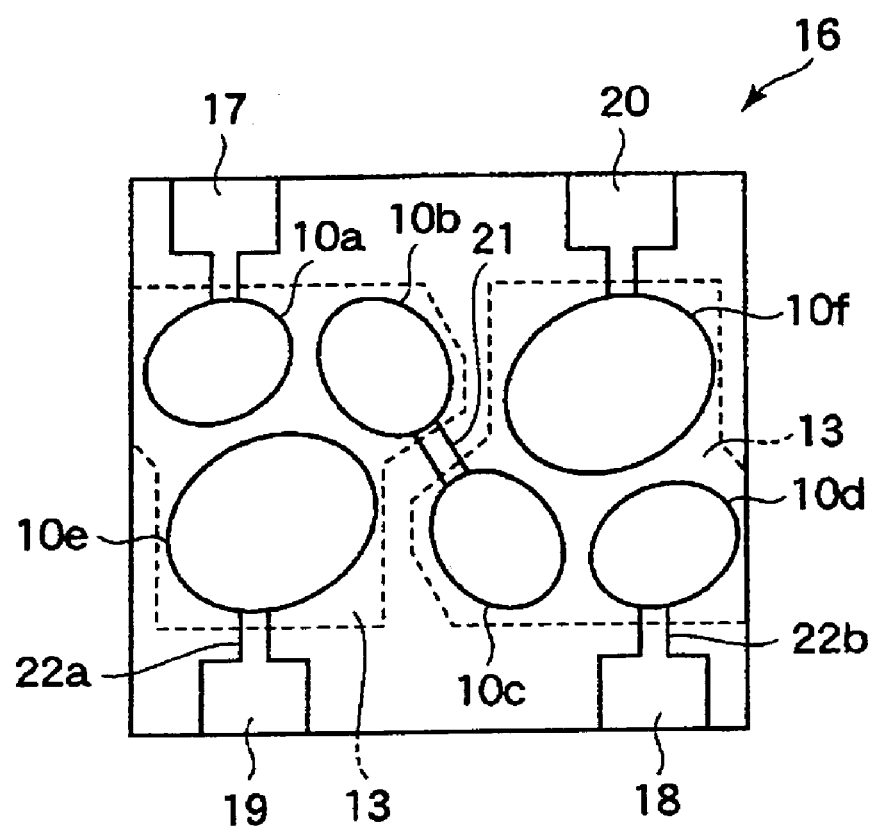
FIG. 7 is an explanatory drawing showing a filter of another modified example of the second embodiment of the present invention.

FIG. 5 is an explanatory drawing showing a filter related to a second embodiment of the present invention, FIG. 6 is an explanatory drawing showing a filter of a modified example of the second embodiment of the present invention, and FIG. 7 is an explanatory drawing showing a filter of another modified example of the second embodiment of the present invention.

In the present embodiment, as shown in FIG. 5, a filter is comprised by a layout such that an extension of each of the major axes of the elliptical shaped piezoelectric thin film resonators 10a to 10d intersects with an extension of the major axis of an adjacent piezoelectric thin film resonator by rotating the elliptical shaped piezoelectric thin film resonators 10a to 10d. Specifically, the filter 16 of the present embodiment comprises a electronic component comprising the piezoelectric thin film resonators 10a to 10d. These piezoelectric thin film resonators 10a to 10d have the same layer structure as that of the piezoelectric thin film resonator 10 shown in FIG. 1.

In the present embodiment, as shown in FIG. 5, an extension of a major axis $S_1$ of the piezoelectric thin film resonator 10a intersects with an extension of a major axis $S_2$ of the piezoelectric thin film resonator 10b, the extension of the major axis $S_2$ of the piezoelectric thin film resonator 10b intersects with an extension of a major axis $S_3$ of the piezoelectric thin film resonator 10c, and the extension of the major axis $S_3$ of the piezoelectric thin film resonator 10c intersects with an extension of a major axis $S_4$ of the piezoelectric thin film resonator 10d.

Note that, in the filter shown in FIG. 5, the extensions of the major axes of the two elliptical shaped piezoelectric thin film resonators, i.e. the first piezoelectric thin film resonator and second piezoelectric thin film resonator intersect with each other; however the major axis of one of the piezoelectric thin film resonators may intersects with the extension of the major axis of the other piezoelectric thin film resonator. In this case, the intersection is within the region of one of the abovementioned other piezoelectric thin film resonators.

In other words, from the perspective of the piezoelectric thin film resonator the region of which does not have the intersection therein, the extension of the major axis thereof intersects with the major axis or an extension thereof of another adjacent piezoelectric thin film resonator having an elliptical shape. Also, from the perspective the piezoelectric thin film resonator the region of which has the intersection therein, the major axis thereof intersects with an extension of the major axis of another adjacent piezoelectric thin film resonator having an elliptical shape.

In this way, the interval between the piezoelectric thin film resonators 10a, 10b and 10e, or the interval between the piezoelectric thin film resonators 10c, 10d and 10f can be narrowed, whereby dimensions efficiency can be improved.

Moreover, with an increase in the degree of freedom of disposition of the resonators under the constrained condition that the shortest distance between the resonators is not changed, the degree of freedom of disposition of the electrode pads also increases.

Note that the rotation angle of the major axis is discretionary, and is not limited to the example shown in FIG. 5. In other words, the respective rotation angles and the positional relationship can be changed appropriately according to a desired layout.

For example, as shown in FIG. 6 and FIG. 7, by a layout such that the interval between the piezoelectric thin film resonators 10e and 10f is narrowed, as well as the electrode pads 17 to 20, dimensions efficiency can be further improved, and the layout density becomes uniform, thus the variation in etching is reduced, and a stable manufacturing quality can be achieved.

Particularly, as shown in FIG. 7, it is preferred that the two electrode pads 19 and 20 are respectively disposed in the vicinities of the two corners on the device substrate having a rectangular shape, the corners being farthest from each other, thereby preventing unnecessary inductive coupling.

Note that it is difficult to achieve such disposition in the conventional filter 116 shown in FIG. 4. This is because the elliptical shaped piezoelectric thin film resonators can be rotated by itself, and can be disposed in all directions with respect to the other elliptical shaped piezoelectric thin film resonators, while only a vertical or horizontal positional relationship is established between the rectangular piezoelectric thin film resonators with respect to the device substrate.

(Third Embodiment)

Figure 8:
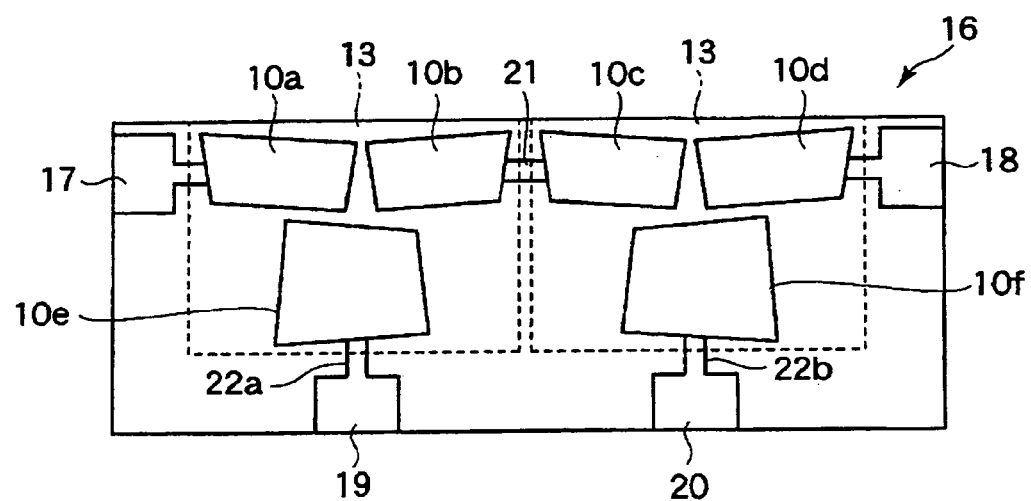
FIG. 8 is an explanatory drawing showing a filter related to a third embodiment of the present invention.
Figure 9:
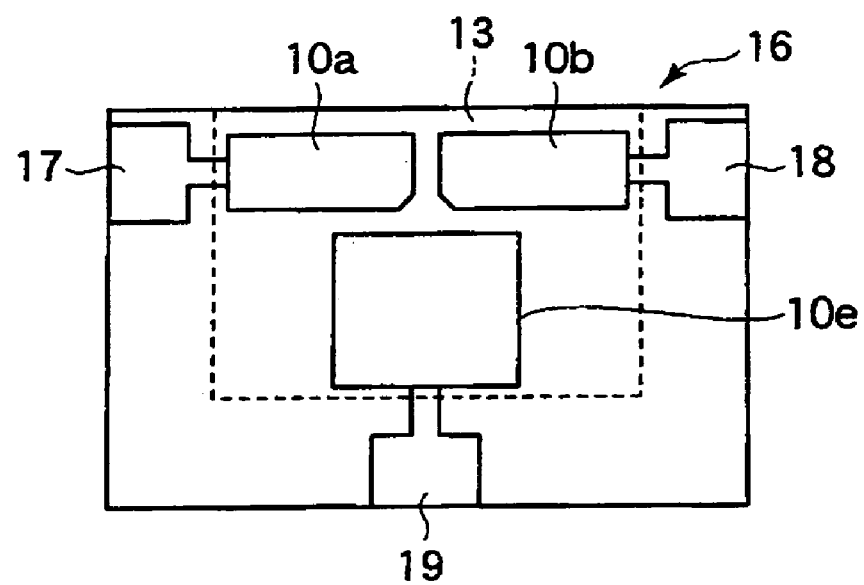
FIG. 9 is an explanatory drawing showing a filter of a first modified example of the third embodiment of the present invention.
Figure 10:
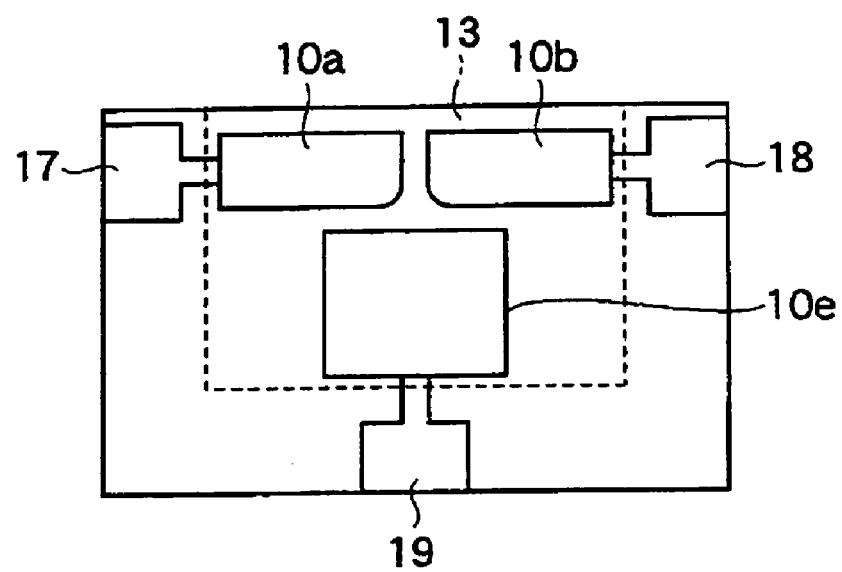
FIG. 10 is an explanatory drawing showing a filter of a second modified example of the third embodiment of the present invention.
Figure 11:
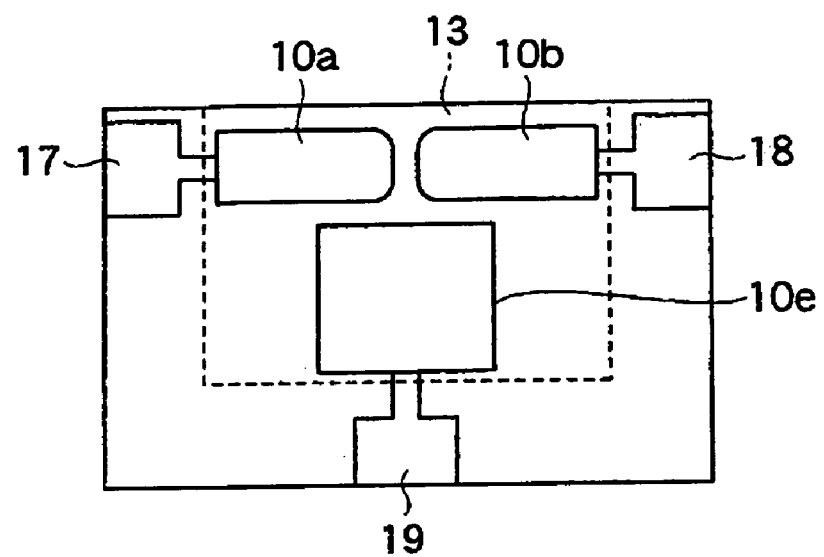
FIG. 11 is an explanatory drawing showing a filter of a third modified example of the third embodiment of the present invention.
Figure 12:
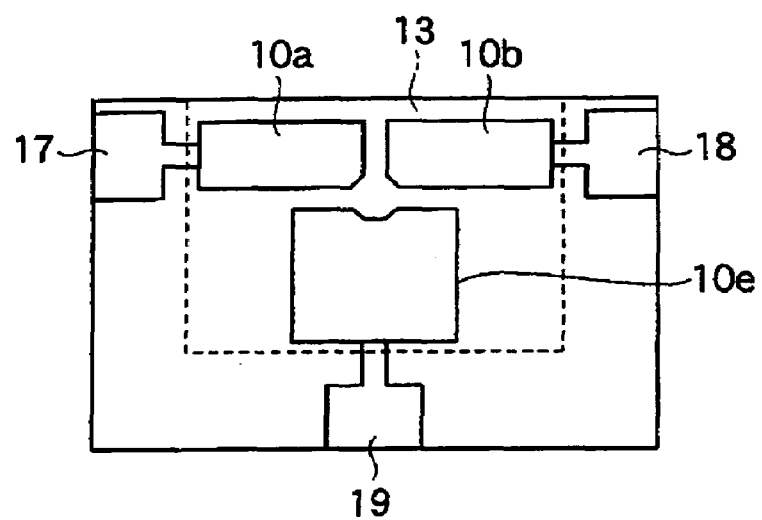
FIG. 12 is an explanatory drawing showing a filter of a fourth modified example of the third embodiment of the present invention.
Figure 13:
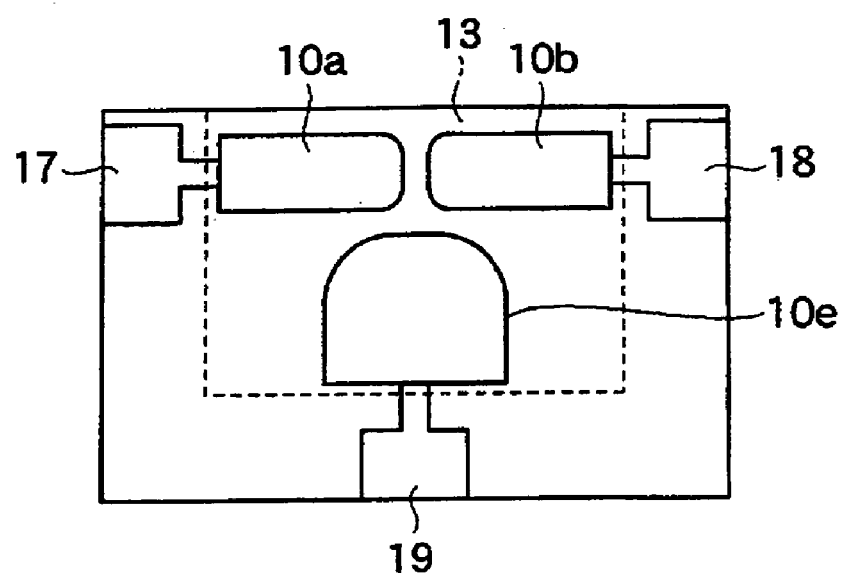
FIG. 13 is an explanatory drawing showing a filter of a fifth modified example of the third embodiment of the present invention.
Figure 14:
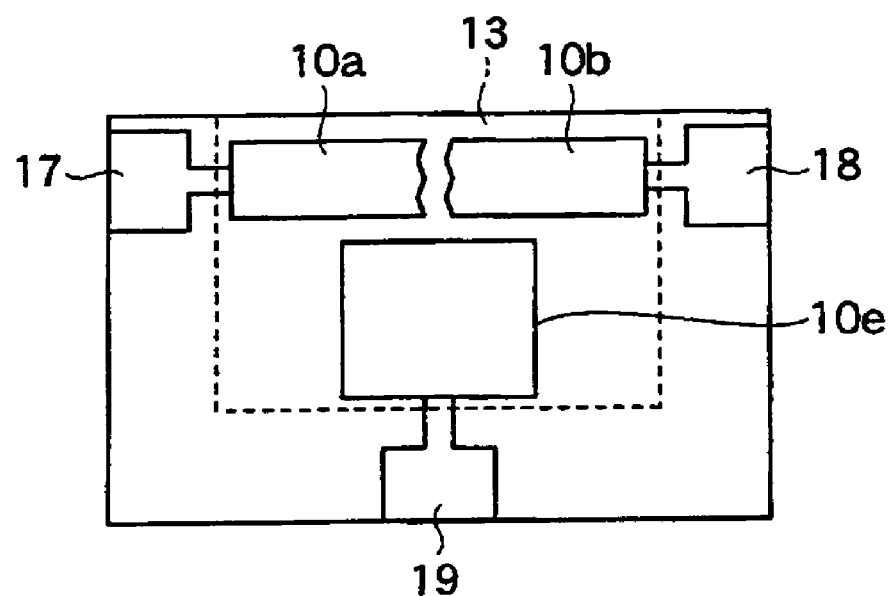
FIG. 14 is an explanatory drawing showing a filter of a sixth modified example of the third embodiment of the present invention.
Figure 15:
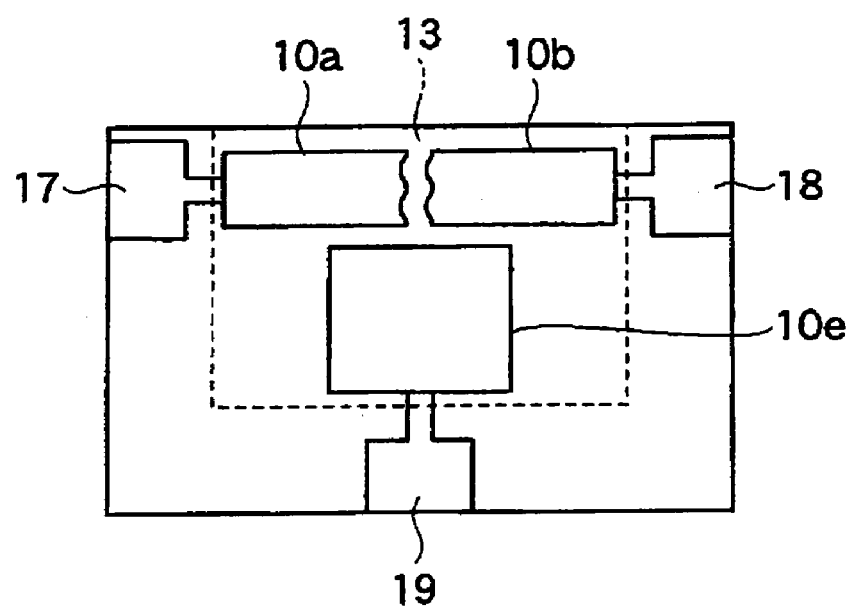
FIG. 15 is an explanatory drawing showing a filter of a seventh modified example of the third embodiment of the present invention.
Figure 16:
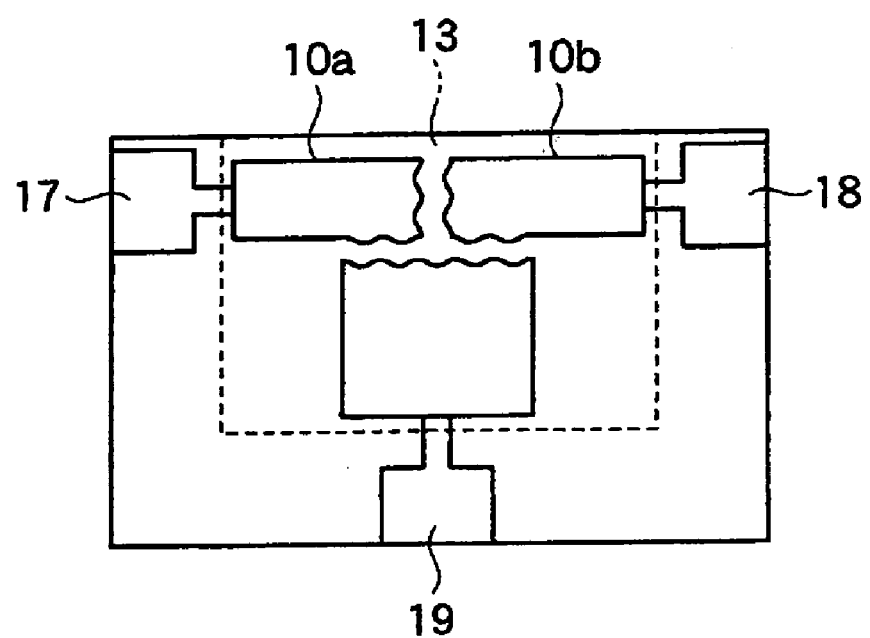
FIG. 16 is an explanatory drawing showing a filter of an eighth modified example of the third embodiment of the present invention.

FIG. 8 is an explanatory drawing showing a filter related to a third embodiment of the present invention, FIG. 9 is an explanatory diagram showing a filter of a first modified example of the third embodiment of the present invention, FIG. 10 is an explanatory drawing showing a filter of a second modified example of the third embodiment of the present invention, FIG. 11 is an explanatory drawing showing a filter of a third modified example of the third embodiment of the present invention, FIG. 12 is an explanatory drawing showing a filter of a fourth modified example of the third embodiment of the present invention, FIG. 13 is an explanatory drawing showing a filter of a fifth modified example of the third embodiment of the present invention, FIG. 14 is an explanatory drawing of a filter of a sixth modified example of the third embodiment of the present invention, FIG. 15 is an explanatory drawing showing a filter of a seventh modified example of the third embodiment of the present invention, and FIG. 16 is an explanatory drawing showing a filter of an eighth modified example of the third embodiment of the present invention.

In the filter shown in FIG. 8, the piezoelectric thin film resonators 10a to 10f with a polygonal shape where the facing sides thereof are not parallel. Specifically, the filter shown in FIG. 8 comprises electronic components comprising the piezoelectric thin film resonators 10a to 10f having the same layer structure as that of the piezoelectric thin film resonator 10 shown in FIG. 1. As with the first embodiment, of the peripheries of the piezoelectric thin film resonators 10a to 10f, two peripheries facing each other are not parallel. Note that, in FIG. 8, the dimensions of each of the piezoelectric thin film resonator is equal to that in the example shown in FIG. 2. Specifically, the area of the each piezoelectric thin film resonator is an area in which the upper electrode, piezoelectric thin film and lower electrode overlap each other in the lamination direction.

By forming the piezoelectric thin film resonators 10a to 10f into such a shape, the interval between the facing outer circumference portions, i.e. the interval between the peripheries, of a piezoelectric thin film resonator (the piezoelectric thin film resonator 10a, for example) and another piezoelectric thin film resonator (the piezoelectric thin film resonator 10b, for example) adjacent to the above piezoelectric thin film resonator is no longer constant.

Therefore, in the present embodiment as well, the patterns are no longer concentrated, thus the patterning defects caused by the resist residue or a decrease in the etching rate during the pattern formation can be prevented.

Further, the parallel sections no longer exist on the facing outer circumference portions of the adjacent piezoelectric thin film resonators, thus the conditions under which the phases of the two adjacent piezoelectric thin film resonators are coherent are eliminated, and occurrence of unnecessary acoustic coupling can be prevented.

In addition, since the conditions under which the phases of the two piezoelectric thin film resonators are coherent are eliminated as described above, the degree of freedom of layout of the piezoelectric thin film resonators can be increased.

A desired operational effect can be achieved even if the peripheries of the piezoelectric thin film resonators are formed into a polygonal shape as described above, instead of forming the piezoelectric thin film resonators into an elliptical shape as in the first embodiment and the second embodiment. In other words, in the present invention the interval between the facing outer circumference portions of a piezoelectric thin film resonator and another piezoelectric thin film resonator adjacent to the above piezoelectric thin film resonator does not have to be constant, and various shapes, such as a polygon having more angles than a triangle or pentagon, circle, ellipse, or a shape having a combination thereof, can be employed. Further, the section where the interval is not constant may range partially, but does not have to range in the entire area of the facing outer circumference portions.

To cite some examples, the shapes of the filter to be employed can be: a shape in which one sides of the facing corners of the piezoelectric thin film resonators 10a and 10b are cut off straight as shown in the first modified example in FIG. 9; a shape in which one sides of the facing corners of the piezoelectric thin film resonators 10a and 10b are cut off to be curved as shown in the second modified example in FIG. 10; a shape in which both sides of the facing corners of the piezoelectric thin film resonators 10a and 10b are cut to be curved as shown in the third modified example in FIG. 11; a shape in which one sides of the facing corners of the piezoelectric thin film resonators 10a and 10b are cut off straight, and in which a part of the piezoelectric thin film resonator 10e at the vicinity of the cut-off corners is cut out as shown in the fourth modified example in FIG. 12; and a shape in which both sides of the facing corners of the piezoelectric thin film resonators 10a and 10b are cut to be curved, and in which the two corners of the piezoelectric thin film resonator 10e on the piezoelectric thin film resonators 10a and 10b side are cut to be curved.

Also, considered is a shape in which a desired effect can be achieved not only when the interval between the facing outer circumference portions of the two adjacent piezoelectric thin film resonators is not constant as described above, but also when it is constant.

This is an example when the facing outer circumference portions of a piezoelectric thin film resonator and another piezoelectric thin film resonator adjacent to the above piezoelectric thin film resonator are formed into a curved line or an engrailed line so that the interval therebetween is constant. Here as well, note that the section formed into a curved line or an engrailed line may range partially, but does not have to range in the entire area of the facing outer circumference portions. That is, a part of the periphery of the first piezoelectric thin film resonator and a part of the periphery of the second piezoelectric thin film resonator which face each other are formed into an engrailed line or a curved line, and the interval between the both engrailed lines or the both curved lines may be constant.

To cite some examples as described above, the shapes to be employed can be: a shape in which the facing outer circumference portions (sides) of the piezoelectric thin film resonators 10a and 10b are formed into engrailed lines with keeping equal interval therebetween as shown in the sixth modified example in FIG. 14; a shape in which the facing outer circumference portions (sides) of the piezoelectric thin film resonators 10a and 10b are formed into curved lines with keeping equal interval therebetween as shown in the seventh modified example in FIG. 15; and a shape in which the facing outer circumference portions (sides) of the piezoelectric thin film resonators 10a and 10b are formed into curved lines with keeping equal interval therebetween, and also the outer circumference portions (sides) of the piezoelectric thin film resonators 10a and 10b and the outer circumference portion of the piezoelectric thin film resonator 10e that face each other are formed into curved lines with keeping equal interval therebetween as shown in the eighth modified example in FIG. 16.

The above description is the example where the present invention is configured with an SMR type piezoelectric thin film resonator; however, the present invention can be applied to the stack type piezoelectric thin film resonators, such as a diaphragm-type piezoelectric thin film resonator for performing acoustically total reflection, in a state in which the piezoelectric thin film between the upper and lower electrodes is exposed up and down to the atmosphere.

As described in above preferred embodiments of the present invention, the following effects can be achieved according to the present invention.

Specifically, according to the present invention, since the pattern of the piezoelectric thin film resonators is not concentrated, the patterning defects caused by the resist residue or a decrease in the etching rate during the pattern formation can be prevented.

Furthermore, according to the present invention, since the parallel sections on the facing outer circumference portions of the adjacent piezoelectric thin film resonators no longer exist, the conditions under which the phases of the two piezoelectric thin film resonators are coherent are eliminated, and occurrence of unnecessary acoustic coupling can be prevented.

Moreover, according to the present invention, since the conditions under which the phases of the two piezoelectric thin film resonators are assembled are eliminated as described above, the degree of freedom of layout of the piezoelectric thin film resonators can be increased.

In addition, by respectively disposing the two ground electrode pads in the vicinities of the two corners on the rectangular device substrate, the corners being farthest from each other, unnecessary inductive coupling can be prevented.

What is claimed is:

1. An electronic component, comprising:
   a first piezoelectric thin film resonator; and
   a second piezoelectric thin film resonator provided next to the first piezoelectric thin film resonator,
   each of the first piezoelectric thin film resonator and second piezoelectric thin film resonator being a piezoelectric thin film resonator that has a structure in which a piezoelectric thin film is interposed between a first electrode film and a second electrode film, that is constituted in an area where the first electrode film, the piezoelectric thin film, and the second electrode film overlap each other, and that obtains a signal with a predetermined resonance frequency by bulk waves propagating inside the piezoelectric thin film,
   wherein, when assuming two straight lines intersecting at a part of a periphery of the first piezoelectric thin film resonator and a part of a periphery of the second piezoelectric thin film resonator which face each other, the distance between a point at the intersection of one of the two straight lines with the part of the first piezoelectric thin film resonator and a point at the intersection of the straight line with the part of the second piezoelectric thin film resonator is different from the distance between a point at the intersection of the other straight line of the two straight lines with the part of the first piezoelectric thin film resonator and a point at the intersection of the other straight line with the part of the second piezoelectric thin film resonator,
   the first piezoelectric thin film resonator and the second piezoelectric thin film resonator have an elliptical shape, and
   an extension of a major axis with respect to the periphery of the first piezoelectric thin film resonator intersects with a major axis or an extension thereof with respect to the periphery of the second piezoelectric thin film resonator.

2. The electronic component according to claim 1, wherein the piezoelectric thin film of the first piezoelectric thin film resonator and the piezoelectric thin film of the second piezoelectric thin film resonator are continuous.

3. A filter comprising the electronic component defined in claim 1.

4. The filter according to claim 3, further comprising:
an input electrode pad;
an output electrode pad;
a first wiring portion formed between the input electrode pad and the output electrode pad; and
a second wiring portion formed between the first wiring portion and a ground electrode pad,
wherein:
one of the first piezoelectric thin film resonator and the second piezoelectric thin film resonator is electrically connected to the first wiring portion;
the other of the first piezoelectric thin film resonator and the second piezoelectric thin film resonator is electrically connected to the second wiring portion; and
the other of the first piezoelectric thin film resonator and the second piezoelectric thin film resonator has an anti-resonance frequency substantially equal to the resonance frequency of the one of the first piezoelectric thin film resonator and the second piezoelectric thin film resonator.

5. The filter according to claim 4, further comprising a device substrate having a rectangular shape, wherein the ground electrode pads are respectively disposed in the vicinities of two corners on the device substrate, the corners being farthest from each other.

6. A filter, comprising:
a first piezoelectric thin film resonator;
a second piezoelectric thin film resonator provided next to the first piezoelectric thin film resonator;
each of the first piezoelectric thin film resonator and second piezoelectric thin film resonator being a piezoelectric thin film resonator that has a structure in which a piezoelectric thin film is interposed between a first electrode film and a second electrode film, that is constituted in an area where the first electrode film, the piezoelectric thin film, and the second electrode film overlap each other, and that obtains a signal with a predetermined resonance frequency by bulk waves propagating inside the piezoelectric thin film;
an input electrode pad;
an output electrode pad;
a first wiring portion formed between the input electrode pad and the output electrode pad; and
a second wiring portion formed between the first wiring portion and a ground electrode pad,
wherein:
the piezoelectric thin film of the first piezoelectric thin film resonator and the piezoelectric thin film of the second piezoelectric thin film resonator are continuous;
a periphery of the first piezoelectric thin film resonator facing a periphery of the second piezoelectric thin film resonator includes a portion formed with an engrailed line or a curved line;
the periphery of the second piezoelectric thin film resonator facing the periphery of the first piezoelectric thin film resonator comprises a portion formed with an engrailed line or a curved line which has a constant interval with respect to said engrailed line or curved line;
one of the first piezoelectric thin film resonator and the second piezoelectric thin film resonator is electrically connected to the first wiring portion;
the other of the first piezoelectric thin film resonator and the second piezoelectric thin film resonator is electrically connected to the second wiring portion; and
the other of the first piezoelectric thin film resonator and the second piezoelectric thin film resonator has an anti-resonance frequency substantially equal to the resonance frequency of the one of the first piezoelectric thin film resonator and the second piezoelectric thin film resonator.

7. The filter according to claim 6, further comprising a device substrate having a rectangular shape, wherein the ground electrode pads are respectively disposed in the vicinities of two corners on the device substrate, the corners being farthest from each other.

* * * * *